(12) United States Patent
Harima

(10) Patent No.: US 7,551,040 B2
(45) Date of Patent: Jun. 23, 2009

(54) SURFACE MOUNT CRYSTAL OSCILLATOR

(75) Inventor: Hidenori Harima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 144 days.

(21) Appl. No.: 11/724,529

(22) Filed: Mar. 15, 2007

(65) Prior Publication Data
US 2007/0229178 A1 Oct. 4, 2007

(30) Foreign Application Priority Data
Mar. 17, 2006 (JP) ............................. 2006-074601

(51) Int. Cl.
H03B 1/00 (2006.01)
H03B 5/32 (2006.01)
H01L 41/053 (2006.01)

(52) U.S. Cl. ...................... 331/68; 331/67; 331/108 C; 331/108 D; 331/158; 310/348

(58) Field of Classification Search ................... 331/67, 331/68, 108 C, 108 D, 158; 310/348
See application file for complete search history.

(56) References Cited
U.S. PATENT DOCUMENTS
4,293,986 A * 10/1981 Kobayashi et al. ......... 29/25.35

| | | | | |
|---|---|---|---|---|
| 6,452,460 B2 * | 9/2002 | Oda | ............................. | 331/68 |
| 6,720,837 B2 | 4/2004 | Moriya et al. | | |
| 6,847,265 B2 * | 1/2005 | Tanaka et al. | ............ | 331/108 D |
| 7,034,441 B2 * | 4/2006 | Ono et al. | .................... | 310/344 |
| 7,123,108 B2 * | 10/2006 | Isimaru | ....................... | 331/68 |

FOREIGN PATENT DOCUMENTS
JP 2000-134037 5/2000

* cited by examiner

*Primary Examiner*—Robert Pascal
*Assistant Examiner*—Levi Gannon
(74) *Attorney, Agent, or Firm*—Muirhead and Saturnelli, LLC

(57) ABSTRACT

A surface mount crystal oscillator comprises a package body having a first recess, a cover having a second recess, a crystal blank secured to an inner bottom surface of the second recess, and an IC chip secured to a bottom surface of the first recess. The IC chip has an oscillation circuit using the crystal oscillator integrated therein, and has IC terminals on one main surface for connection to the outside. A first and a second annular metal film are disposed to surround open end surfaces of the first recess and second recess, respectively. By bonding the first and second annular metal films with an eutectic alloy, the crystal blank and IC chip are hermetically sealed in a space defined by the integrated first and second recesses.

6 Claims, 4 Drawing Sheets

ABSTRACT
SURFACE MOUNT CRYSTAL OSCILLATOR

BACKGROUND OF THE INVENTION

1. Field of the Invention

The present invention relates to a crystal oscillator which comprises a crystal blank and an IC (integrated circuit) chip that has integrated therein an oscillation circuit using the crystal blank, both of which are contained in a surface mount package, and more particularly, to a surface mount crystal oscillator which ensures an area for accommodating an IC chip in a package.

2. Description of the Related Arts

Surface mount crystal oscillators, which have a quartz crystal blank and an IC chip that has integrated therein an oscillation circuit using the crystal blank, both of which are contained in a surface mount package, are built in a variety of portable electronic devices in particular as reference sources for frequency and time because of their small sizes and light weights. Particularly, a temperature compensated crystal oscillators are widely employed in mobile telephones and the like because such temperature compensated crystal oscillators provide a high frequency stability against variations in ambient temperature. A representative surface mount crystal oscillator is referred to as a one-chamber type which contains an IC chip and a crystal blank in the same recess formed in a package, for example, as shown in U.S. Pat. No. 6,720,837.

FIG. 1A illustrates a conventional surface mount crystal oscillator in a one-chamber structure. The illustrated crystal oscillator comprises IC chip 2 and crystal blank 3 accommodated in a recess formed in package body 1 of a surface mount type, and flat metal cover 4 placed over the recess to hermetically seal IC chip 2 and crystal oscillator 3. Package body 1 is formed of laminated ceramics which include flat and substantially rectangular bottom wall layer 1b, and frame wall layer 1a having a substantially rectangular opening. The opening formed through frame wall layer 1a defines a recess for containing IC chip 2 and crystal blank 3. A step is formed on the inner wall of frame wall layer 1a on one side, and a pair of crystal holding terminals 6 are formed on the top surface of the step for use in holding crystal blank 2.

Mounting terminals 5 are disposed at four corners of the outer bottom surface of package body 1 for use in surface-mounting the crystal oscillator on a wiring board. These mounting terminals 5 include a power supply terminal, a ground terminal, an output terminal for providing an oscillation output, and the like. Shield electrode 7 is also embedded in bottom wall layer 1b for electromagnetically shielding IC chip 2 from the wiring board. Shield electrode 7 is electrically connected to the ground terminal among mounting terminals 5.

IC chip 2 has electronic circuits, which include an oscillation circuit using crystal blank 3, integrated on a semiconductor substrate. The oscillation circuit is formed on one main surface of the semiconductor substrate by a general semiconductor device fabricating process. Here, a circuit forming surface will refer to one of the two main surfaces of IC chip 2 on which the oscillation circuit is formed. A plurality of IC terminals are also formed on the circuit forming surface for connecting IC chip 2 to external circuits. The IC terminals include a power supply terminal, a ground terminal, an oscillation output terminal, a pair of connection terminals for connection with crystal blank 3, and the like.

Circuit terminals are provided on the bottom surface of the recess in package body 1 in correspondence to the IC terminals. The circuit terminals corresponding to the power supply terminal, ground terminal, and oscillation output terminal on IC chip 2 are electrically connected to mounting terminals 5 through conductive paths routed on a plane in which frame wall layer 1a is laminated on bottom wall layer 1b, and on an outer surface of package body 1. Circuit terminals corresponding to the pair of connection terminals on IC chip 2 are electrically connected to the pair of crystal holding terminals 6 through via holes 11 extended through frame wall layer 1a at positions of the step. IC chip 2 is secured on the bottom surface of the recess by electrically and mechanically connecting the IC terminals to the circuit terminals through ultrasonic thermo-compression bonding using bumps 8, such that the circuit forming surface opposes the bottom surface of the recess in package body 1. In a temperature compensated crystal oscillator, IC chip 2 is provided with write terminals, which belong to the IC terminals, for writing temperature compensation data into a temperature compensation mechanism within IC chip 2. The write terminals are electrically connected to external write terminals, not shown, disposed on the outer side surface of package body 1.

Metal cover 4 is bonded to a metal ring provided on an open end face, that is, the upper surface of package body 1 which surrounds the recess in package body 1, through seam or beam welding, and is electrically connected to the ground terminal within mounting terminal 5 through via hole 11 extended through frame wall layer 1a.

As illustrated in FIG. 1B, crystal blank 3, which comprises, for example, a substantially rectangular AT-cut quartz crystal blank, is formed with excitation electrodes 9a on both main surfaces, respectively. From these excitation electrodes 9a, lead-out electrodes 9b are extended toward both ends of one side of crystal blank 3, respectively. Crystal blank 3 is secured to crystal holding terminals 6 with conductive adhesive 10 at both ends of the one side thereof to which lead-out electrodes 9b are extended, thereby electrically and mechanically connecting crystal blank 3 to crystal holding terminals 6 and holding crystal blank 3 within the recess.

However, in the surface mount crystal oscillator in the foregoing configuration, the step is required on the inner wall of package body 1 for holding crystal blank 3 because crystal blank 3 is positioned above IC chip 2 in the recess of package body 1, and the recess is closed by flat metal cover 4. This results in a lower proportion of an area available for accommodating IC chip 2 to the outer planar dimensions of package body 1. Stated another way, assuming that IC chip 2 of the same size is contained, package body 1 is larger than that which is not provided with the step, thus constituting impediments to a reduction in size of the crystal oscillator. Particularly, the temperature compensated crystal oscillator requires larger IC chip 2 due to a temperature compensation mechanism integrated in IC chip 2, so that the resulting crystal oscillator has limitations to a reduction in size.

Japanese Patent Laid-open Application No. 2000-134037 (JP-A-2000-134037) discloses a crystal oscillator which includes a package body having a recess, an insulating cover formed in a concave shape, an IC chip secured in the recess of the package body, and a crystal blank secured in a concave portion of the insulating cover, wherein the insulating cover is secured to the package body with an anisotropic conductive adhesive to seal the crystal blank and IC chip without forming a step on the inner wall of the package. In this configuration, the elimination of the need for the step formed on the inner wall of the package body results in a higher proportion of an area available for accommodating the IC chip to the outer planar dimensions of the package body, thus making it possible to reduce the size of the crystal oscillator.

However, the crystal oscillator described in JP-A-2000-134037 experiences difficulties in maintaining the airtightness or sealablility in a space in which the crystal blank is sealed, and is prone to suffer from insufficient electric connections between the crystal blank and IC chip, because the insulating cover is secured to the package body with the anisotropic conductive adhesive.

SUMMARY OF THE INVENTION

It is an object of the present invention to provide a surface mount crystal oscillator which is capable of reducing the outer planar dimensions thereof while ensuring an area available for accommodating an IC chip in a package, improving the airtightness or sealability in a space in which a crystal blank and the IC chip are contained, and ensuring electric connections between the IC chip and crystal blank.

The object of the present invention is achieved by a surface mount crystal oscillator which includes a package body having a first recess, a cover having a second recess, a crystal blank, and an IC chip having an oscillation circuit using the crystal blank integrated therein, and having IC terminals on one main surface thereof for use in connection to the outside, wherein the IC chip is secured to an inner bottom surface of the first recess, and a pair of crystal holding terminals are disposed on an inner bottom surface of the second recess, the crystal blank comprises excitation electrodes formed on a pair of main surfaces, respectively, and a pair of lead-out electrodes extended respectively from the excitation electrodes to both ends of one side of the crystal blank, both the ends of the one side being secured to the pair of crystal holding terminals, the package body has, on an open end surface of the first recess, a first annular metal film formed to surround the first recess, and a pair of first crystal connection terminals electrically connected to the IC terminals electrically independently of the first annular metal film, the cover has, on an open end surface of the second recess, a second annular metal film formed to surround the second recess, and a pair of second crystal connection terminal electrically connected to the crystal holding terminals electrically independently of the second annular metal film, the cover is bonded to the package body by bonding the first annular metal film and the second annular metal film with an eutectic alloy to integrate the first and second recesses, to hermetically seal the crystal blank and the IC chip in a space defined by the integrated first and second recesses, and the first crystal connection terminals and the second crystal connection terminals are bonded with an eutectic alloy to electrically connect the crystal blank to the IC chip.

In the present invention, the cover is preferably made of an insulating material. More preferably, the package body and cover are both made of laminated ceramics.

In the configuration as described above, since the crystal blank is secured to and held on the inner bottom surface of the cover, the package body need not be provided with a step on the inner wall of the recess, thus making it possible to increase an area available for accommodating the IC chip in the package body. The present invention is particularly suitable for a reduction in size of a surface mount crystal oscillator which has highly functional added values such as a surface mount temperature compensated crystal oscillator. Also, since the first and second annular metal films are connected with the eutectic alloy, and the first and second crystal connection terminals are also bonded with the eutectic alloy, the airtightness of sealability is improved between the package body and insulating cover, and the reliability of the electric connection between the IC chip and crystal blank is also improved.

DETAILED DESCRIPTION OF THE PREFERRED EMBODIMENTS

Figure 1A:
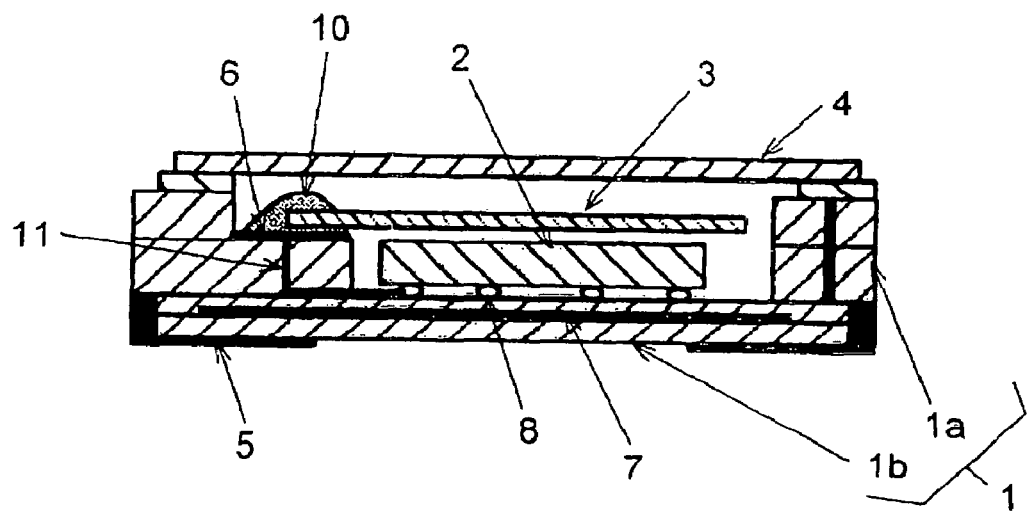
FIG. 1A is a cross-sectional view illustrating the configuration of a conventional surface mount crystal oscillator.
Figure 2:
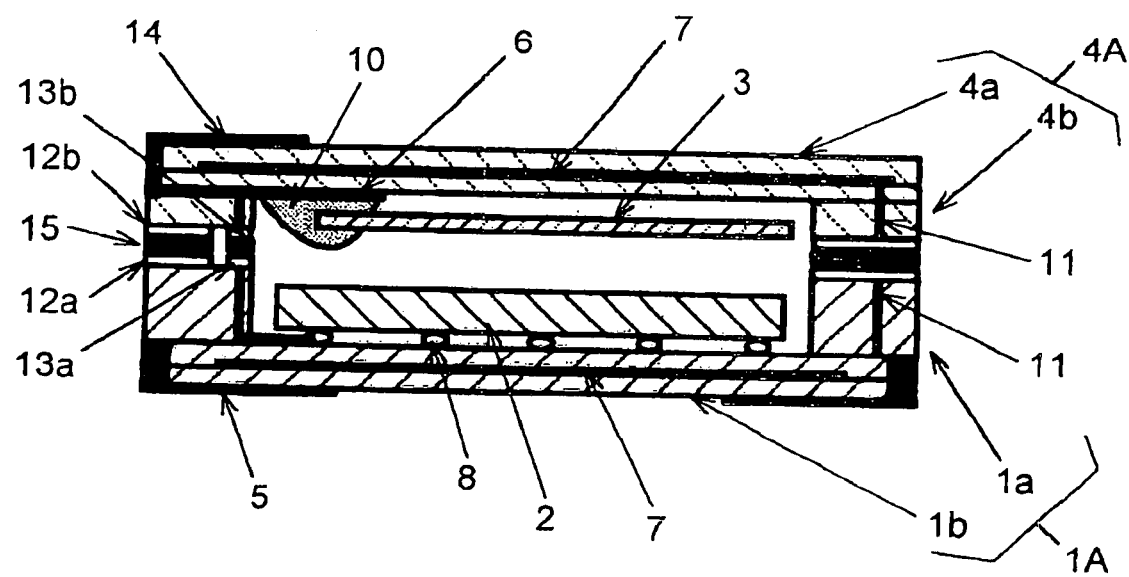
FIG. 2 is a cross-sectional view illustrating the configuration of a surface mount crystal oscillator according to one embodiment of the present invention.

In FIG. 2 which illustrates a surface mount crystal oscillator according to one embodiment of the present invention, the same components as those in FIG. 1A are designated the same reference numerals, and repeated descriptions will be omitted.

The surface mount crystal oscillator illustrated in FIG. 2 comprises package body 1 of a surface mount type having a recess, and insulating cover 4A formed in a concave shape. Insulating cover 4A is bonded to package body 1A for integration such that the recess of package body 1A opposes the recess of insulating cover 4, to hermetically seal IC chip 2 and quartz crystal blank 3 in a space defined by package body 1A and insulating cover 4A. Package body 1A is formed of laminated ceramics which include flat and substantially rectangular bottom wall layer 1b, and frame wall layer 1a having a substantially rectangular opening. The opening formed through frame wall layer 1a defines a recess. Mounting terminals 5 are disposed at four corners of the outer bottom surface of package body 1A for use in surface mounting the crystal oscillator on a wiring board in a manner similar to the foregoing. Shield electrode 7 is disposed on a plane in which ceramic sheets in bottom wall layer 1b are laminated on each other. Shield electrode 7 is connected to a ground terminal within mounting terminals 5. External write terminals (not shown) are provided on the outer side surface of package body 1 for use in writing temperature compensation data to a temperature compensation mechanism within IC chip 2

Figure 3A:
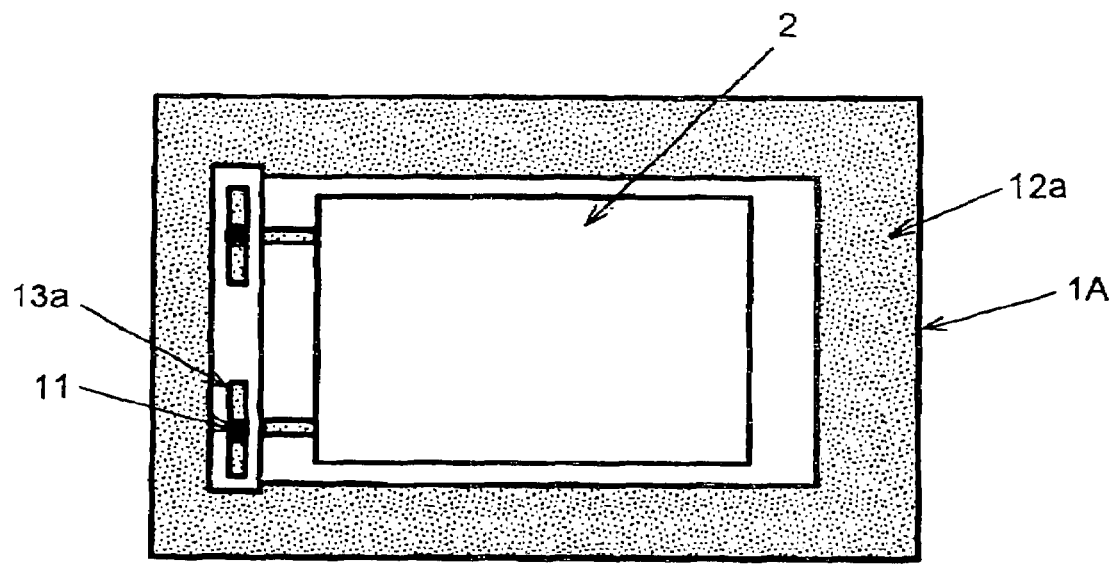
FIG. 3A is a plan view illustrating a package body.

On an open end surface which surrounds the recess of package body 1A, first annular metal film 12a is disposed to make a round along the periphery of the recess, as illustrated in FIG. 3A. First annular metal film 12a is electrically connected to the ground terminal within mounting terminals 5 through via hole 11 extended through frame wall layer 1a of package body 1A. In addition, a pair of first crystal connection terminals 13a are disposed, electrically independently of first annular metal film 12a, extending inwardly from one side of package body 1A on the open end surface.

Figure 3B:
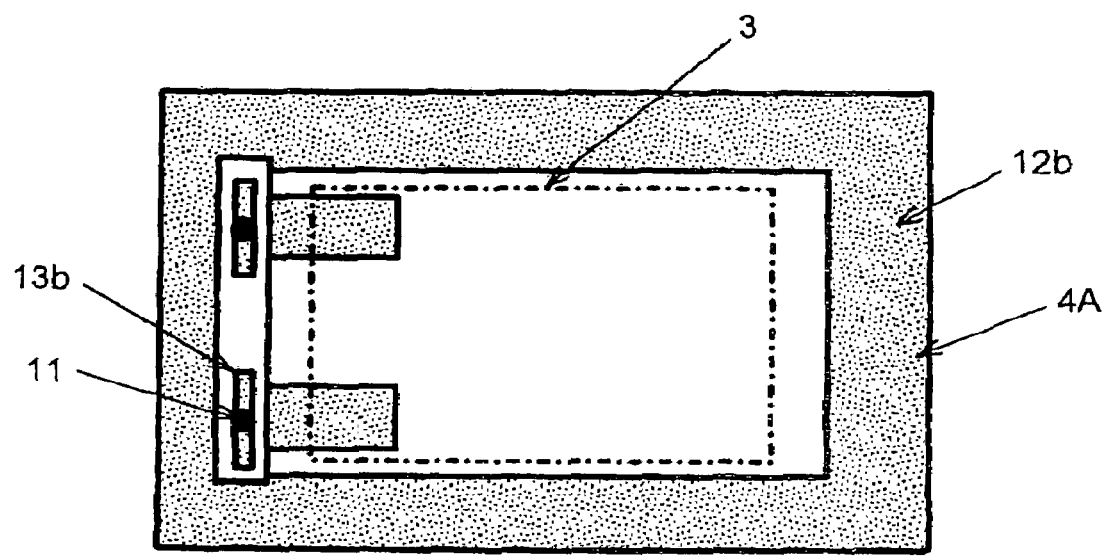
FIG. 3B is a plan view illustrating an insulating cover.

Insulating cover 4A is formed of laminated ceramics which include flat and substantially rectangular bottom wall layer 4a, and frame wall layer 4b having a substantially rectangular opening. The opening formed through frame wall layer 4b defines a recess. On an open end surface which surrounds the recess of insulating cover 4A, second annular metal film 12b is disposed to make a round along the periphery of the recess, as illustrated in FIG. 3B. A pair of second crystal connection terminals 13b are also disposed, electrically independently of first annular metal film 12b, extending inwardly from one side of insulating cover 4A on the open end surface. Second annular metal film 12b and second crystal connection terminals 13b are formed at positions which correspond to the positions at which first annular metal film 12a and first crystal connection terminals 13a are formed in package body 1, respectively.

A pair of crystal holding terminals 6 for holding crystal blank 3 are disposed at both ends on one side of the bottom surface of the recess in insulating cover 4A, i.e., on the surface of bottom wall layer 4a. Crystal holding terminals 6 are electrically connected to second crystal connection terminals 13b through via holes 11 extended through frame wall layer 4b. A pair of no crystal testing terminals 14 are also disposed on outer side surfaces and/or top surface of insulating cover 4A. Crystal testing terminals 14 are electrically connected to crystal holding terminals 6, respectively, through conductive paths routed on a plane in which frame wall layer 4b is laminated on bottom wall layer 4a. Shield electrode 7 is disposed on a plane in which one ceramic sheet is laminated on another within bottom wall layer 4a. Shield electrode 7 is electrically connected to second annular metal film 12b through via hole 11.

IC chip 2 has its circuit forming surface secured to the inner bottom surface of package body 1A through ultrasonic thermo-compression bonding using bumps 8. Among IC terminals of IC chip 2, a power supply terminal, an output terminal, a ground terminal and the like are electrically connected to mounting terminals 5.

Figure 1B:
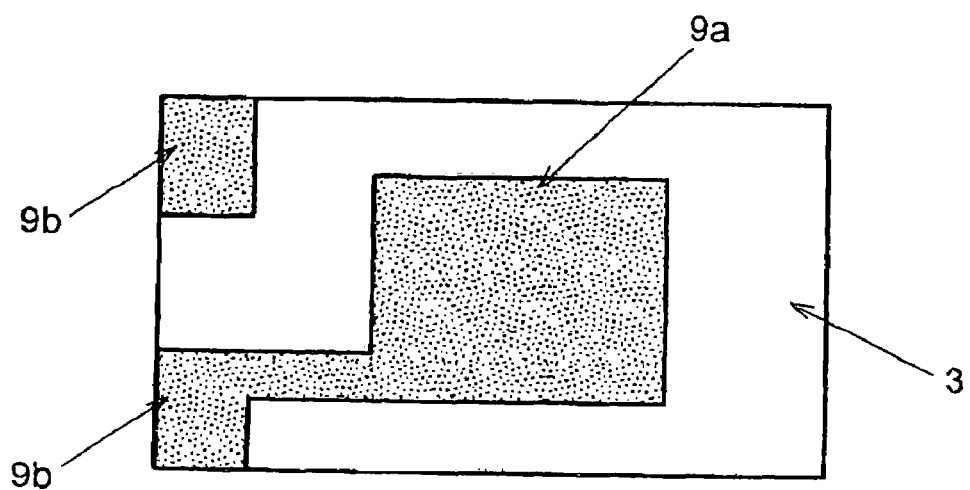
FIG. 1B is a plan view illustrating a crystal blank.

Crystal blank 3 described in connection with FIG. 1B is employed herein, and is held under insulating cover 4A by securing both ends of one side, from which lead-out electrodes 9b extend, to crystal holding terminals 6 with conductive adhesive 10.

In the crystal oscillator of this embodiment, first annular metal film 12a on package body 1A is bonded to second annular metal film 12b on insulating cover 4A to integrate package body 1A with insulating cover 4A, with the result that IC chip 2 and crystal blank 3 are hermetically sealed in a space defined by package body 1A and insulating cover 4A. Insulating cover 4A is bonded to package body 1A, for example, by applying eutectic alloy 15 on first annular metal film 12a on package body 1A, and bonding the open end surface of package body 1A to the open end surface of insulating cover 4A in opposition to each other through thermo-compression bonding. In this event, first crystal connection terminals 13a on package body 1A are also applied with eutectic alloy 15, such that first crystal connection terminals 13a are bonded to second crystal connection terminals 13b simultaneously through the thermo-compression bonding. Stated another way, the open end surfaces of package body 1 and insulating cover 4A are placed in opposition to each other, first and second annular metal films 12a, 12b are bonded with eutectic alloy 15, and simultaneously, first and second connection-terminals 13a, 13b are bonded with eutectic alloy 15.

In the manufacturing of such a crystal oscillator, a process of securing IC chip 2 to package body 1A, and a process of securing crystal blank 3 to insulating cover 4A are performed in parallel in different processes from each other. Then, after crystal blank 3 is secured to insulating cover 4A to create an assembly, oscillation characteristics of crystal blank 3, which serves as a crystal element, are measured through crystal testing terminals 14, for example, before insulating cover 4A is bonded to package body 1A. If any defect is found in crystal impedance (CI) or the like, the assembly is removed from subsequent processes. Further, after bonding insulating cover 4A to package body 1A, the oscillation characteristics of the crystal blank as a crystal element are measured through crystal testing terminals 14 in order to confirm the presence or absence of influences on the bonding.

In the foregoing configuration, since crystal blank 3 is secured to and held on the inner bottom surface of insulating cover 4A, package body 1A need not be provided with a step on the inner wall thereof, which has been required for conventional crystal oscillators. As a result, a larger area can be made available for accommodating IC chip 2 in package body 1A by the eliminated step, thus accomplishing a reduction in size of the surface mount crystal oscillator. Particularly, according to this configuration, even when package body 1A is reduced in the outer planar dimensions, package body 1A can accommodate large IC chip 2 which has a temperature compensation mechanism integrated therein.

In this embodiment, since first annular metal film 12a on package body 1A is bonded to second annular metal film 12b on insulating cover 4A with eutectic alloy 15, the airtightness or sealability can be improved as compared with glass sealing, resin sealing and the like. In addition, a mechanical strength can be ensured with reliability. Further, since first and second crystal connection terminals 13a, 13b are also bonded with the eutectic alloy, IC chip 2 can be electrically connected to crystal blank 3 with reliability.

By providing insulating cover 4A with crystal testing terminals 14, the oscillation characteristics of the crystal element (i.e., crystal blank 3) can be independently measured before and after insulating cover 4A is bonded to package body 1A. It is therefore possible to detect defects when crystal blank 3 is secured to insulating cover 4A, and after insulating cover 4A is bonded to package body 1A, to improve the cost efficiency and reliability. Crystal testing terminals 14 may be disposed only on the outer side surfaces of insulating cover 4A or only on the top surface of the same. In this connection, when crystal testing terminals 14 are provided on the top surface of insulating cover 4A, crystal testing terminals 14 can be increased in area to facilitate bringing a measuring probe into contact with crystal testing terminals 14, resulting in improved workability. Also, in this crystal oscillator, since shield electrode 7 is disposed in lamination plane within insulating cover 4A as well, this shield electrode 7 can prevent, together with shield electrode 7 in package body 1A, noise from introducing or radiating from both main surfaces of the crystal oscillator having a flat shape, to provide reliable EMI (electromagnetic immunity) countermeasures. In an alternative configuration, shield electrode 7 may be disposed on the inner bottom surface or outer surface of insulating cover 4A.

Figure 4A:
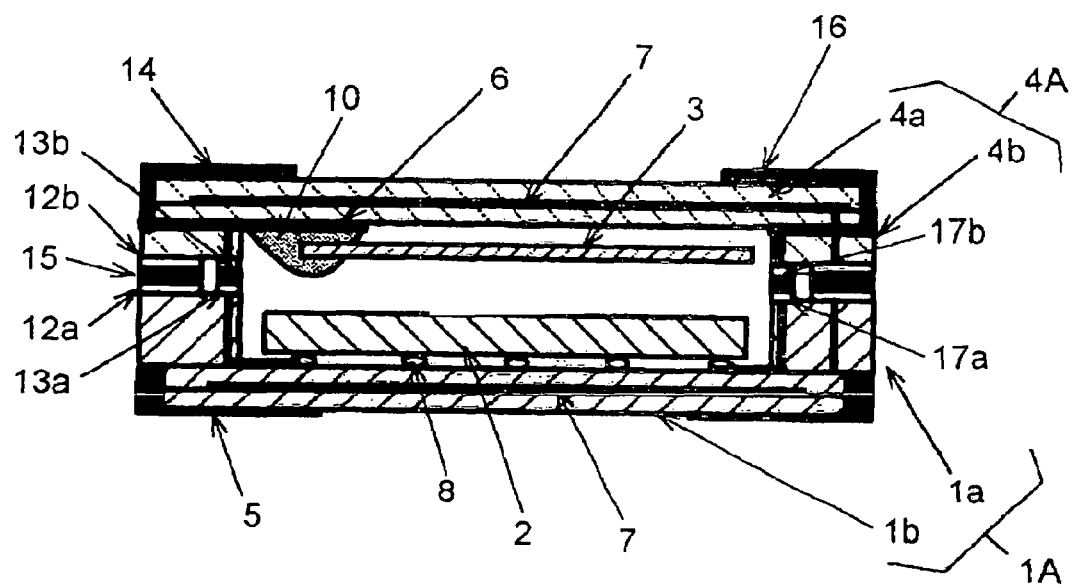
FIG. 4A is a cross-sectional view illustrating the configuration of a surface mount crystal oscillator according to another embodiment of the present invention.
Figure 4B:
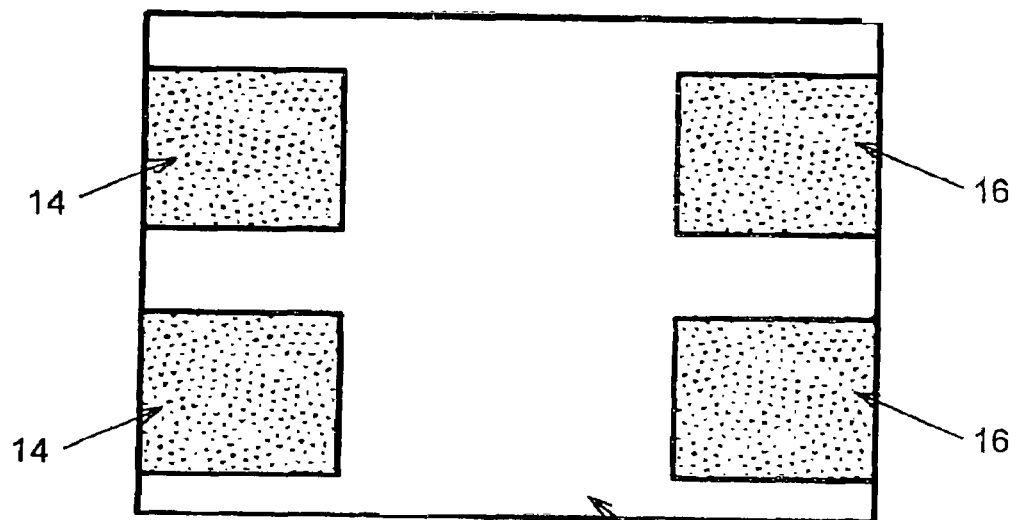
FIG. 4B is a top plan view illustrating an insulating cover for use in the crystal oscillator illustrated in FIG. 4A.

In the crystal oscillator described above, crystal testing terminals 14 alone are disposed on the side surfaces and/or top surface of insulating cover 4A, but alternatively, a pair of external write terminals 16, for example, may be disposed on the top surface and/or side surface of insulating cover 4A for use in writing temperature compensation data, in addition to a pair of crystal testing terminals 14, for example, as illustrated in FIGS. 4A and 4B. In this configuration, IC chip 2 is electrically connected to external write terminals 16 by bonding a pair of connection terminals 17a disposed on the open end surface of package body 1A to a pair of connection terminals 17b disposed on the open end surface of insulating cover 4A with eutectic alloy 15. Connection terminals 17a, 17b provided herein may be similar to crystal connection terminals 13a, 13b.

Each of the foregoing crystal oscillators is provided with mounting terminals at the four corners on the outer bottom surface of package body 1A such that package body 1A is attached to a wiring board. Alternatively, terminals for connection to the power supply terminal, output terminal, and ground terminal within the IC terminals may be disposed on the outer surface of insulating cover 4A such that insulating cover 4A is attached to a wiring board. When these terminals are disposed on the outer surface of insulating cover 4A, the crystal testing terminals and external write terminals can be disposed on any surface except for the top surface of insulating cover 4A.

Further, in the present invention, crystal testing terminals 14 may be provided on outer side surfaces of package body 1A, instead of insulating cover 4A. While the foregoing description has been made on the assumption that the crystal oscillator is a temperature compensated type, crystal oscillator to which the present invention can be applied are not limited to the temperature compensated type, but the present invention can be applied to any arbitrary type of surface mount crystal oscillators.

What is claimed is:

1. A surface mount crystal oscillator, comprising:
    a package body having a first recess;
    a cover having a second recess;
    a crystal blank; and
    an IC chip having an oscillation circuit using said crystal blank integrated therein, and having IC terminals on one main surface thereof for use in connection to outside,
    wherein said IC chip is secured to an inner surface of said first recess, and a pair of crystal holding terminals are disposed on an inner surface of said second recess,
    said crystal blank comprises excitation electrodes formed on a pair of main surfaces, respectively, and a pair of lead-out electrodes extended respectively from said excitation electrodes to both ends of one side of said crystal blank, wherein both said ends of the one side are secured to said pair of crystal holding terminals,
    said package body has, on an open end surface of said first recess, a first annular metal film formed to surround said first recess, and a pair of first crystal connection terminals electrically connected to said IC terminals electrically independently of said first annular metal film,
    said cover has, on an open end surface of said second recess, a second annular metal film formed to surround said second recess, and a pair of second crystal connection terminal electrically connected to said crystal holding terminals electrically independently of said second annular metal film,
    said cover is bonded to said package body by bonding said first annular metal film and said second annular metal film with an eutectic alloy in a first eutectic alloy bond to integrate said first and second recesses and to hermetically seal said crystal blank and said IC chip in a space defined by said integrated first and second recesses, and
    said first crystal connection terminals and said second crystal connection terminals are bonded with an eutectic alloy in a second eutectic alloy bond to electrically connect said crystal blank to said IC chip, wherein the first eutectic alloy bond that bonds the first annular metal film and the second annular metal film is separated from the second eutectic alloy bond that bonds the first crystal connection terminals and the second crystal connection terminals.

2. The crystal oscillator according to claim 1, wherein said cover is made of an insulating material.

3. The crystal oscillator according to claim 2, wherein said package body and said cover are both made of laminated ceramics.

4. The crystal oscillator according to claim 2, further comprising a shield electrode disposed in said cover and electrically connected to said second annular metal film.

5. The crystal oscillator according to claim 1, further comprising crystal testing terminals disposed on an outer surface of said cover and electrically connected to said crystal holding terminals.

6. The crystal oscillator according to claim 1, further comprising a shield electrode disposed in said package body and electrically connected to said first annular metal film.

* * * * *